United States Patent
Lim et al.

(10) Patent No.: US 8,058,711 B2
(45) Date of Patent: Nov. 15, 2011

(54) FILLER FOR FILLING A GAP AND METHOD FOR MANUFACTURING SEMICONDUCTOR CAPACITOR USING THE SAME

(75) Inventors: Sang-Hak Lim, Uiwang-si (KR);
Hui-Chan Yun, Uiwang-si (KR);
Dong-Il Han, Uiwang-si (KR);
Taek-Soo Kwak, Uiwang-si (KR);
Jin-Hee Bae, Uiwang-si (KR);
Jung-Kang Oh, Uiwang-si (KR);
Sang-Kyun Kim, Uiwang-si (KR);
Jong-Seob Kim, Uiwang-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 0 days.

(21) Appl. No.: 12/956,549

(22) Filed: Nov. 30, 2010

(65) Prior Publication Data

US 2011/0129981 A1   Jun. 2, 2011

(30) Foreign Application Priority Data

Dec. 2, 2009   (KR) ................ 10-2009-0118751

(51) Int. Cl.
*H01L 23/58* (2006.01)
*H01L 21/469* (2006.01)
*H01L 21/20* (2006.01)
*G11B 5/706* (2006.01)

(52) U.S. Cl. ........ 257/642; 525/940; 428/845; 438/780; 257/E29.015

(58) Field of Classification Search .............. 257/642, 257/E29.015; 438/780, 381; 525/940; 428/845
See application file for complete search history.

(56) References Cited

U.S. PATENT DOCUMENTS 5,010,158 A   4/1991   Colombier et al.
(Continued)

FOREIGN PATENT DOCUMENTS

EP   0 890 599 A1 *   1/1999
(Continued)

OTHER PUBLICATIONS

Takahiro Gunji et al., "Preparation of Polysiloxazanes and Thier Transformation to Silcon Oxynitride", 2006, Journal of Ceramic Society of Japan, vol. 114, No. 6, pp. 492-496.*

*Primary Examiner* — William D Coleman
(74) *Attorney, Agent, or Firm* — Lee & Morse, P.C.

(57) ABSTRACT

A filler for filling a gap includes a hydrogenated polysiloxazane having an oxygen content of about 0.2 to about 3 wt %. A chemical structure of the hydrogenated polysiloxazane includes first, second, and third moieties represented by the following respective Chemical Formulas 1-3:

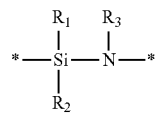

[Chemical Formula 1]

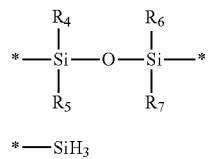

[Chemical Formula 2]

$* — SiH_3$   [Chemical Formula 3]

The third moiety is on a terminal end of the hydrogenated polysiloxazane, and an amount of the third moiety is about 15 to about 35% based on a total amount of Si—H bonds in the hydrogenated polysiloxazane.

18 Claims, 3 Drawing Sheets

U.S. PATENT DOCUMENTS

| | | | |
|---|---|---|---|
| 5,322,913 A * | 6/1994 | Blum et al. | 528/15 |
| 5,912,203 A | 6/1999 | Burkus, II et al. | |
| 6,207,779 B1 * | 3/2001 | Chang et al. | 526/280 |
| 6,562,465 B1 | 5/2003 | Nakashima et al. | |
| 6,767,641 B1 | 7/2004 | Shimizu et al. | |
| 7,081,501 B2 * | 7/2006 | Okawa et al. | 525/327.2 |
| 7,582,685 B2 | 9/2009 | Arney et al. | |
| 7,785,948 B2 | 8/2010 | Kamata et al. | |
| 2006/0057855 A1 * | 3/2006 | Ramos et al. | 438/710 |
| 2010/0140756 A1 | 6/2010 | Kozasa et al. | |

FOREIGN PATENT DOCUMENTS

| | | |
|---|---|---|
| JP | 10-046108 | 2/1998 |
| JP | 10-194826 | 7/1998 |
| JP | 2000-239387 A | 9/2000 |
| JP | 2001-308090 A | 11/2001 |
| JP | 2008-159824 A | 7/2008 |
| KR | 1989-0010043 A | 8/1989 |
| KR | 10 2006-0066137 A | 6/2006 |
| KR | 10 2007-0043849 A | 4/2007 |
| KR | 10 2007-0101293 A | 10/2007 |

* cited by examiner

[FIG. 1]
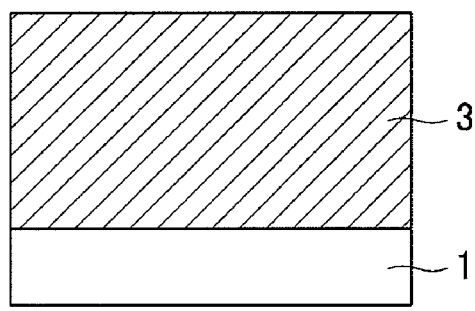
[FIG. 2]
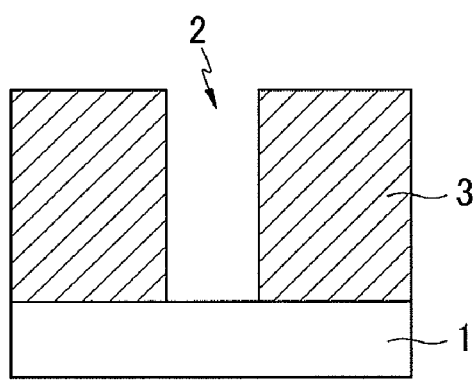
[FIG. 3]
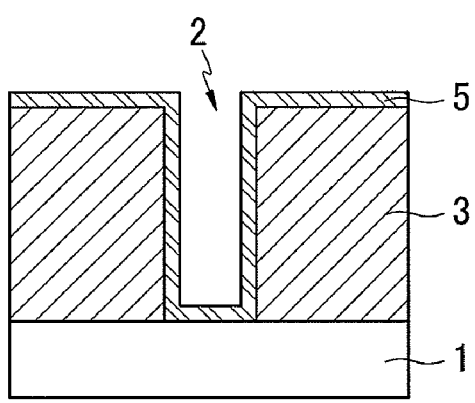

[FIG. 4]
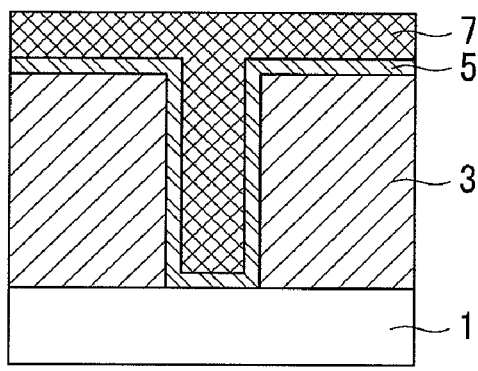
[FIG. 5]
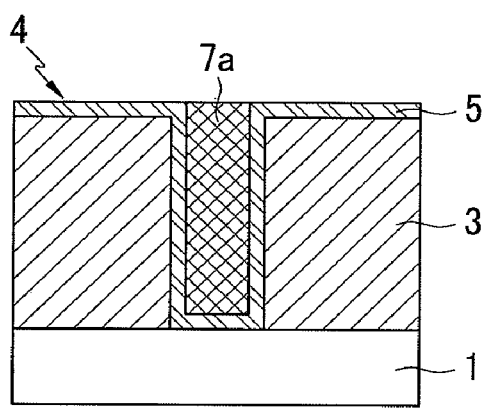
[FIG. 6]
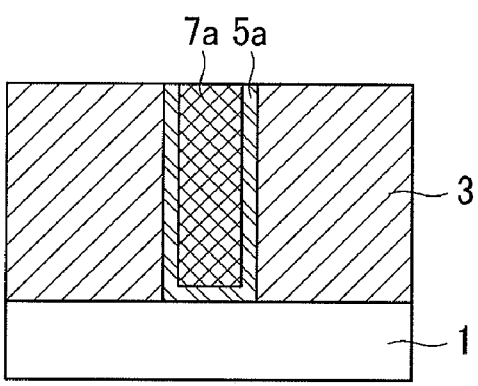

[FIG. 7]
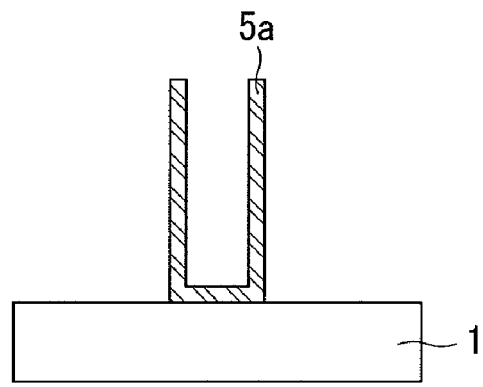
[FIG. 8]
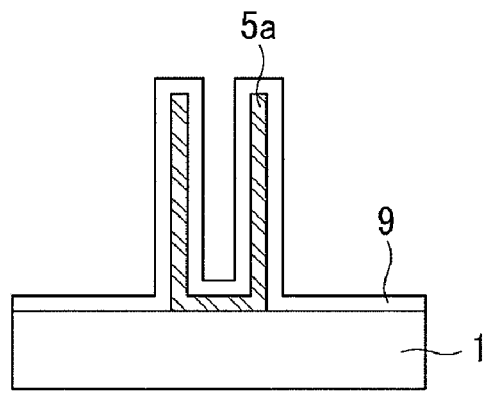
[FIG. 9]
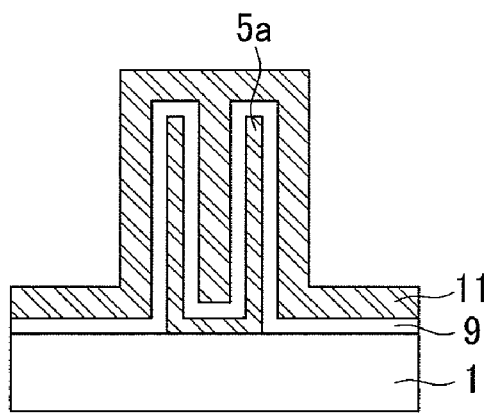

FILLER FOR FILLING A GAP AND METHOD FOR MANUFACTURING SEMICONDUCTOR CAPACITOR USING THE SAME

BACKGROUND

1. Field

Embodiments relates to a filler for filling a gap and a method of manufacturing a semiconductor capacitor using the filler.

2. Description of the Related Art

As semiconductor technology is increasingly developed, there is continuous research on forming highly-integrated and faster semiconductor memory cells that have improved performance and integrate smaller semiconductor chips. Among these semiconductor memory cells, e.g., DRAM (dynamic random access memory) may be used. The DRAM is capable of freely inputting and outputting information, and may realize large capacity.

The DRAM may include, e.g., a plurality of unit cells including one MOS transistor (MOS transistor) and one capacitor. The capacitor may include two electrodes and a dielectric layer disposed therebetween. The capacitor may have various capacities depending on, e.g., a dielectric constant, a thickness of the dielectric layer, an area of the electrodes, and the like.

As a size of a semiconductor chip is reduced, the size of the capacitor therein may also be reduced. However, the smaller capacitor needs sufficient storage capacity. The capacitor may accomplish bigger capacity by, e.g., increasing the vertical area instead of decreasing the horizontal area to increase overall active area. When a capacitor is formed in this way, a filler may be used to fill, e.g., a mold and a gap, thereon, and to effectively form an electrode thereafter.

SUMMARY

At least one of the above and other features and advantages may be realized by providing a filler for filling a gap that includes hydrogenated polysiloxazane having an oxygen content of about 0.2 to about 3 wt %. A chemical structure of the hydrogenated polysiloxazane includes first and second moieties represented by the following respective Chemical Formulas 1 and 2:

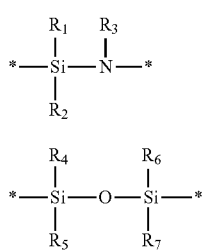

[Chemical Formula 1]

[Chemical Formula 2]

Wherein $R_1$ to $R_7$ are each independently one of a hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof.

A terminal end of the hydrogenated polysiloxazane includes a third moiety represented by the following Chemical Formula 3:

 [Chemical Formula 3]

Wherein an amount of the third moiety is about 15 to about 35% based on a total amount of Si—H bonds in the hydrogenated polysiloxazane.

The hydrogenated polysiloxazane may have a weight average molecular weight of about 1,000 to about 5,000. The hydrogenated polysiloxazane may have a weight average molecular weight of about 1,500 to about 3,500. The oxygen content of the hydrogenated polysiloxazane may be about 0.4 to about 2 wt %. The hydrogenated polysiloxazane may be included in an amount of about 0.1 to about 50 wt % based on the total amount of the filler. The filler may include a thermal acid generator that is capable of generating an acid when heated, and an amount of the thermal acid generator is about 0.01 to about 25 wt % based on a total amount of the filler. The filler may include a surfactant, and an amount of the surfactant is about 0.001 to about 10 wt % based on a total amount of the filler. The filler may be capable of filling substantially the entire gap, the gap having a width of less than about 50 nm, having a height greater than the width, and being surrounded by a conductive layer of an electrode.

At least one of the above and other features and advantages may also be realized by providing a method of manufacturing a semiconductor capacitor using a filler. The method includes forming a mold layer with a gap on a semiconductor substrate, forming a conductive layer on the semiconductor substrate and the mold, and forming a filler layer by coating a filler in the gap and on the conductive layer. The method also includes heat-treating the filler layer, developing a part of the filler layer to form a filling pattern filled in the gap, removing a part of the conductive layer to form a first electrode, and removing the mold layer and the filling pattern. The method further includes forming a dielectric layer on the first electrode, and forming a second electrode on the dielectric layer. Wherein the filler includes a hydrogenated polysiloxazane having an oxygen content of about 0.2 to about 3 wt %. A chemical structure of the hydrogenated polysiloxazane includes first and second moieties represented by the following respective Chemical Formulas 1 and 2:

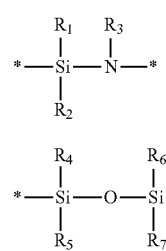

[Chemical Formula 1]

[Chemical Formula 2]

Wherein $R_1$ to $R_7$ are each independently one of a hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof.

Further, a terminal end of the hydrogenated polysiloxazane includes a third moiety represented by the following Chemical Formula 3:

*—SiH$_3$ [Chemical Formula 3]

Wherein an amount of the third moiety is about 15 to about 35% based on a total amount of Si—H bonds in the hydrogenated polysiloxazane.

The heat treatment of the filler layer may be performed at about 200° C. or higher under vapor-containing atmosphere. The oxygen content of the hydrogenated polysiloxazane may be based on the amount of pure water added during an intermediate step of forming filler.

Accordingly, the present invention may provide a filler being capable of preventing contraction during the heat treatment and having excellent filling properties for a gap with a small width and thus, filling a minute gap. The filler may be uniformly and densely filled with no air void or tiny gap and bring about excellent flatness on the surface of a layer.

BRIEF DESCRIPTION OF THE DRAWINGS

The above and other features and advantages will become more apparent to those of ordinary skill in the art by describing in detail exemplary embodiments with reference to the attached drawings, in which:

FIGS. 1 to 9 illustrate cross-sectional views of stages in a method of manufacturing a semiconductor capacitor using a filler according to an exemplary embodiment.

DETAILED DESCRIPTION

Korean Patent Application No. 10-2009-0118751, filed on Dec. 2, 2009, in the Korean Intellectual Property Office, and entitled: "Filler for Filling A Gap and Method for Manufacturing Semiconductor Capacitor Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. As those skilled in the art would realize, the described embodiments may be modified in various different ways, all without departing from the spirit or scope of the present invention.

In the drawing figures, the dimensions of layers and regions, e.g., thickness of layers, films, panels, regions, may be exaggerated for clarity of illustration. It will also be understood that when a layer or element is referred to as being "on" another layer or substrate, it can be directly on the other layer or substrate, or intervening layers may also be present. In contrast, when an layer or element is referred to as being "directly on" another layer or element, there are no intervening elements present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, when a definition is not otherwise provided, the term "substituted" refers to one substituted with at least one substituent that is one or more of a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or or a salt thereof, a phosphoric acid group or a salt thereof, an alkyl group, a C2 to C16 alkenyl group, a C2 to C16 alkynyl group, an aryl group, a C7 to C13 arylalkyl group, a C1 to C4 alkoxide group, a C1 to C20 heteroalkyl group, a C3 to C20 heteroarylalkyl group, a cycloalkyl group, a C3 to C15 cycloalkenyl group, a C6 to C15 cycloalkynyl group, a heterocycloalkyl group, and a combination thereof, instead of hydrogen.

As used herein, when a definition is not otherwise provided, the term "hetero" refers to one including 1 to 3 heteroatoms that is at least one of N, O, S, and P.

Hereinafter, described is a filler for filling a gap according to an exemplary embodiment.

According to an exemplary embodiment, the filler for filling a gap includes hydrogenated polysiloxazane. The hydrogenated polysiloxazane may include moieties in the chemical structure, e.g., part of a functional group on the hydrogenated polysiloxazane, of at least one of the following Chemical Formulas 1 and 2:

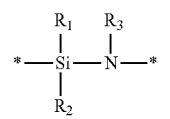

[Chemical Formula 1]

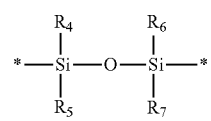

[Chemical Formula 2]

In Chemical Formulas 1 and 2, $R_1$ to $R_7$ each independently are or include one of a hydrogen, a substituted or unsubstituted C1 to C30 alkyl group, substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof. In an exemplary embodiment, at least one of $R_1$ to $R_7$ is a hydrogen. In Chemical Formulas 1 and 2, the designation "*" refers to connection points of the moieties with non-illustrated portions of the chemical structure of the hydrogenated polysiloxazane.

The range C1 to C30 of the substituted or unsubstituted alkyl group represents a broad range. Exemplary embodiments include a range that is within a narrower range that includes, but is not limited to, e.g., C5 to C25, C10 to C20, and C15 to C25. The range C3 to C30 of the substituted or unsubstituted cycloalkyl group represents a broad range. Exemplary embodiments include a range that is within a narrower range that includes, but is not limited to, e.g., C5 to C25, C10 to C20, and C15 to C25. The range C6 to C30 of the substituted or unsubstituted aryl group represents a broad range. Exemplary embodiments include a range that is within a narrower range that includes, but is not limited to, e.g., C10 to C25, C10 to C20, and C15 to C25. The range C7 to C30 of the substituted or unsubstituted arylalkyl group represents a broad range. Exemplary embodiments include a range that is within a narrower range that includes, but is not limited to, e.g., C10 to C25, C10 to C20, and C15 to C25. The range C1 to C30 of the substituted or unsubstituted heteroalkyl group represents a broad range. Exemplary embodiments include a range that is within a narrower range that includes, but is not limited to, e.g., C5 to C25, C10 to C20, and C15 to C25. The range C2 to C30 of the substituted or unsubstituted heterocycloalkyl group represents a broad range. Exemplary embodiments include a range that is within a narrower range that includes, but is not limited to, e.g., C5 to C25, C10 to C20, and C15 to C25. The range C2 to C30 of the substituted or unsubstituted alkenyl group represents a broad range. Exemplary embodiments include a range that is within a narrower range that includes, but is not limited to, e.g., C5 to C25, C10 to C20, and C15 to C25.

Without intending to be bound by this theory, the structure of the hydrogenated polysiloxazane according to an exemplary embodiment includes a silicon-oxygen-silicon (Si—O—Si) bond other than, e.g., a silicon-nitrogen (Si—N) bond. This silicon-oxygen-silicon (Si—O—Si) bond may relieve stress during the curing by heat treatment and may decrease contraction.

According to an exemplary embodiment, an oxygen content of the hydrogenated polysiloxazane may be a range of about 0.2 to about 3 wt %. The oxygen content may be within a range of about 0.4 to about 2 wt %. Exemplary embodiments include an oxygen content that is within a narrower range that includes, but is not limited to, e.g., about 0.4 to about 2 wt %, about 0.5 to about 2.5 wt %, and about 1 to about 2 wt %. The oxygen content of the hydrogenated polysiloxazane may be adjusted by adjusting an amount of pure water adding during an intermediate step of forming the filler. Without intending to be bound by this theory, based on the oxygen content, a silicon-oxygen-silicon (Si—O—Si) bond in the structure may sufficiently relieve stress, and reduce or prevent contraction during the heat treatment. Therefore, a crack may not be formed on a filling pattern.

According to an exemplary embodiment, at least one terminal end of the hydrogenated polysiloxazane may include a moiety of the following Chemical Formula 3:

   [Chemical Formula 3]

The moiety represented by the above Chemical Formula 3 may have a terminal end capped with hydrogen. An amount of the moiety may be within a range of about 15 to about 35% based on the total amount of the Si—H bond in the hydrogenated polysiloxazane. A ratio of the $SiH_3$ to the total SiH, i.e., a $SiH_3/SiH$ (total), may be about 0.15 to about 0.35. For example, the *—$SiH_3$ of the moiety may be about 15 to about 35% of the total number of Si—H bonds in the hydrogenated polysiloxazane. Exemplary embodiments include an amount of moiety that is within a narrower range that includes, but is not limited to, e.g., about 20 to about 30% and about 20 to about 25%. Without intending to be bound by this theory, based on the amount of moiety represented by Chemical Formula 3, there may be sufficient oxidation reaction during the heat treatment, and scattering of $SiH_3$ into $SiH_4$ may be reduced or prevented. Accordingly, the Si—H bond may reduce or prevent contraction, and a crack may not be formed on a filling pattern.

The hydrogenated polysiloxazane may have a weight average molecular weight (Mw) within a range of about 1,000 to about 5,000. The weight average molecular weight (Mw) may be within a range of about 1,500 to about 3,500. The Mw may be within a narrower range that includes, but is not limited to, e.g., about 2,000 to about 4,000, and 2,500 to 3,000. Without intending to be bound by this theory, based on the weight average molecular weight (Mw), less components may be evaporated during the heat treatment and fine gaps of less than 50 nm may be filled.

The hydrogenated polysiloxazane may be included in an amount in at least a range of about 0.1 to about 50 wt % based on a total amount, e.g., weight, of the filler. The amount of hydrogenated polysiloxazane may be within a narrower range that includes, but is not limited to, e.g., about 5 to about 40 wt %, about 10 to about 30 wt %, and about 15 to about 25%. Without intending to be bound by this theory, based on the amount of hydrogenated polysiloxazane, the filler may maintain appropriate viscosity and evenly and uniformly fill a gap with substantially no or essentially no voids.

According to an exemplary embodiment, the filler may further include a thermal acid generator (TAG). The thermal acid generator may be, e.g., an additive that improves developing properties of the hydrogenated polysiloxazane. The hydrogenated polysiloxazane may be developed at a relatively low temperature.

The thermal acid generator may include any compound, without particular limit, that generates acid ($H^+$) by heat. For example, the thermal acid generator may include a compound that is activated at 90° C. or higher, that generates sufficient acid, and that has low volatility. Such a thermal acid generator may include, e.g., nitrobenzyl tosylate, nitrobenzyl benzenesulfonate, phenol sulfonate, and a combination thereof.

The thermal acid generator may be included in an amount within a range of about 0.01 to about 25 wt % based on the total amount of the filler. The amount of thermal acid generator may be within a narrower range that includes, but is not limited to, e.g., about 5 to about 20 wt %, about 10 to about 15 wt %. Without intending to be bound by this theory, based on the amount of thermal acid generator, the hydrogenated polysiloxazane may be developed at a low temperature and have improved coating property.

According to an exemplary embodiment, the filler may further include a surfactant. The surfactant is not particularly limited and may include, e.g., nonion-based surfactant of polyoxyethylene alkyl ethers such as, e.g., polyoxyethylene lauryl ether, polyoxyethylene stearyl ether, polyoxyethylene cetyl ether, polyoxyethylene oleyl ether, and the like; polyoxyethylene alkylallyl ethers such as, e.g., polyoxyethylene nonylphenolether, and the like;

polyoxyethylene polyoxypropylene block copolymers; polyoxyethylene sorbitan fatty acid ester such as, e.g., sorbitan monolaurate, sorbitan monopalmitate, sorbitan monostearate, sorbitan monooleate, polyoxyethylene sorbitan monostearate, polyoxyethylene sorbitan trioleate, polyoxyethylene sorbitan tristearate, and the like; fluorine-based surfactant, e.g., EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and the like; and other silicone-based surfactant such as, e.g., a organosiloxane polymer KP341 (Shin-Etsu Chemical Co., Ltd.), and the like.

The surfactant may be included in an amount in a range of about 0.001 to about 10 wt % based on the total amount of the filler. The amount of surfactant may be within a narrower range that includes, but is not limited to, e.g., about 1 to about 9 wt %, and about 5 to about 10 wt %. Without intending to be bound by this theory, based on the amount of surfactant, a dispersion of a solution may be improved and uniform thickness of a layer and filling properties may be increased.

The components, e.g., of the filler, may be dissolved in a solvent to provide a solution. The solvent may be any compound that is capable of dissolving the components and is not particularly limited. According to an exemplary embodiment, the solvent may include least one of alcohols such as, e.g., methanol, ethanol, and the like; ethers such as, e.g., dichloroethyl ether, n-butyl ether, diisoamyl ether, methylphenyl ether, tetrahydrofuran, and the like; glycol ethers such as, e.g., ethylene glycol monomethylether, ethylene glycol monoethylether, and the like; cellosolve acetates such as, e.g., methyl cellosolve acetate, ethyl cellosolve acetate, diethyl cellosolve acetate, and the like; carbitols such as, e.g., methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as, e.g., propylene glycol methylether acetate, propylene glycol propylether acetate, and the like; aromatic hydrocarbons such as, e.g., toluene, xylene, and the like; ketones such as, e.g., methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as, e.g., ethyl acetate, n-butyl acetate, isobutyl acetate, and the like; lactic acid esters such as, e.g., methyl lactate, ethyl lactate, and the like; oxy acetic acid alkyl esters such as, e.g., oxy methyl acetate, oxy ethyl acetate, oxy butyl acetate, and the like; alkoxy acetic acid alkyl esters such as, e.g., methoxy methyl acetate, methoxy ethyl acetate, methoxy butyl acetate, ethoxy methyl acetate, ethoxy ethyl acetate, and the like; 3-oxy propionic acid alkylesters such as, e.g., 3-oxy methyl propionate, 3-oxy ethyl propionate, and the like; 3-alkoxy propionic acid alkyl esters such as, e.g., 3-methoxy methyl propionate, 3-methoxy ethyl propionate, 3-ethoxy ethyl propionate, 3-ethoxy methyl propionate, and the like; 2-oxy propionic acid alkyl esters such as, e.g., 2-oxy methyl propionate, 2-oxy ethyl propionate, 2-oxy propyl propionate, and the like; 2-alkoxy propionic acid alkyl esters such as, e.g., 2-methoxy methyl propionate, 2-methoxy ethyl propionate, 2-ethoxy ethyl propionate, 2-ethoxy methyl propionate, and the like; 2-oxy-2-methyl propionic acid esters such as, e.g., 2-oxy-2-methyl methyl propionate, 2-oxy-2-methyl ethyl propionate, and the like, monooxy monocarboxylic acid alkyl esters of 2-oxy-2-methyl propionic acid esters such as, e.g., 2-methoxy-2-methyl methyl propionate, 2-ethoxy-2-methyl ethyl propionate, and the like; esters such as, e.g., 2-hydroxy ethyl propionate, 2-hydroxy-2-methyl ethyl propionate, hydroxy ethyl acetate, 2-hydroxy-3-methyl methyl butanoate, and the like; ketone acid esters such as, e.g., ethyl pyruvate, and the like.

In addition, a solvent with a high boiling point may be included such as, e.g., at least one of N-methylformamide, N,N-dimethyl formamide, N-methylformanylide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzyl alcohol, benzyl acetate, ethyl benzoate, diethyl oxalate, diethyl malate, γ-butyrolactone, carbonate ethylene, carbonate propylene, phenyl cellosolve acetate, and the like. Of these solvents, diethyleneglycol monomethylether, diethyleneglycol diethylether, ethyl-3-ethoxy propionate, methyl-3-methoxy propinonate, cyclopentanone, cyclohexanone, propyleneglycolmonomethyletheracetate, propyleneglycol dimethyletheracetate, 1-methoxy-2-propanol, ethyl lactate, cyclopentanone, and ethyl hydroxyl acetate may be selected.

For example, at least one of the solvents may have a high boiling point. Without intending to be bound by this theory, the solvent with a high boiling point may reduce or prevent generation of a void in a gap when the gap is filled. The solvent may increase layer flatness, e.g., because it may be slowly volatilized.

The solvent may be included as a balance, e.g., except for the aforementioned components, based on the total amount of the filler.

The aforementioned filler may be used, e.g., to fabricate an electrode when a semiconductor capacitor is fabricated. For example, it may be used to fill a gap in a mold to fabricate an electrode. According to an exemplary embodiment, the filler may foam an electrode with relatively high functionality within a small horizontal area.

FIGS. 1 to 9, illustrate is a method of manufacturing a semiconductor capacitor according to an exemplary embodiment. FIGS. 1 to 9 are cross-sectional views sequentially showing the method of manufacturing a semiconductor capacitor.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Referring to FIG. 1, a mold oxide layer 3 may be disposed on a semiconductor substrate 1. The semiconductor substrate 1 may also include a transistor (not shown), a contact pad (not shown), a contact plug (not shown), and the like, disposed thereon. The mold oxide layer 3 may be made of, e.g., an oxide such as, e.g., silicon oxide ($SiO_2$), TEOS (tetraethylotho silicate), BPSG (boron phosphorus silicate glass), and PSG (phosphor silicate glass). The mold oxide layer 3 may be formed by, e.g., a chemical vapor deposition (CVD) method.

Referring to FIG. 2, a gap 2 may be formed to reveal or expose an element, e.g., a contact plug, on the semiconductor substrate 1. The gap 2 may be formed by e.g., a photolithography process, on the mold oxide layer 3. The gap 2 may be a minute hole. A width of the gap 2 may be less than about 50 nm. The gap 2 may extend through substantially an entire height of the mold oxide layer 3, such that a height of the gap 2 is substantially equal to a height of the mold oxide layer 3. The gap 2 may have an aspect ratio of more than 1 between the height and the width, e.g., the height of the gap 2 may be greater than a width of the gap 2. For example, the height of the gap 2 may be greater than 50 nm. The height of the gap 2 may be at least 250 nm when the width of the gap is less than 50 nm.

Referring to FIG. 3, a conductive layer 5 may be laminated on the semiconductor substrate 1 and the mold oxide layer 3. The conductive layer 5 may also be formed to surround the gap 2, e.g., the conductive layer may cover substantially an entire outer boundary of the gap 2. The conductive layer 5 may be a single layer or multilayer. The conductive layer 5 may be made of, e.g., at least one of a metal with low resistivity such as, e.g., aluminum (Al), copper (Cu), silver (Ag), and an alloy thereof; a metal such as, e.g., nickel (Ni), titanium (Ti), and the like, polysilicon, or the like. The conductive layer 5 may be formed in, e.g., a sputtering, a chemical vapor deposition (CVD) method, or the like.

Referring to FIG. 4, a filler layer 7 may be disposed on the conductive layer 5. The filler layer 7 may be, e.g., a silica layer comprising the filler including hydrogenated polysiloxazane.

The chemical structure of the hydrogenated polysiloxazane may include moieties represented by the following Chemical Formulas 1 and 2:

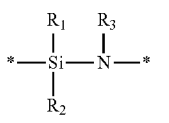

[Chemical Formula 1]

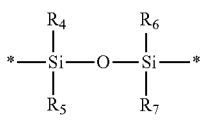

[Chemical Formula 2]

In Chemical Formulas 1 and 2, $R_1$ to $R_7$ each independently are or include one of hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof.

The hydrogenated polysiloxazane may have an oxygen content of about 0.2 to 3 wt %. The oxygen content may be based on an amount of pure water added as an additive during a method of manufacturing the filler. Based on the oxygen content, a silicon-oxygen-silicon (Si—O—Si) bond in the structure may sufficiently relieve stress and reduce or prevent contraction during the heat treatment. Therefore, a crack on a filling pattern may not be formed.

At least one terminal end of the hydrogenated polysiloxazane may include a moiety of the following Chemical Formula 3:

*—SiH$_3$ [Chemical Formula 3]

The moiety represented by the above Chemical Formula 3 may have a terminal end capped with hydrogen. The moiety may be included in an amount of about 15 to 35% based on the total amount of the Si—H bond in the hydrogenated polysiloxazane structure. Based on the amount of the moiety, SiH$_3$ may be prevented from scattering into SiH$_4$ during the heat treatment. According contraction may be reduced or prevented, and a crack on a filling pattern despite sufficient oxidation may not be formed.

The hydrogenated polysiloxazane may have a weight average molecular weight (Mw) within a range of about 1,000 to about 5,000. The weight average molecular weight (Mw) may be within a range of about 1,500 to about 3,500. Based on the weight average molecular weight (Mw), the filler may include less commponents evaporating during the heat treatment but still fill a gap of less than about 50 nm.

The hydrogenated polysiloxazane may be included in an amount of about 0.1 to about 50 wt % based on the total amount, e.g., weight, of the filler. Based on the amount of hydrogenated polysiloxazane, the filler may maintain appropriate viscosity and bring about flat and even gap-fill with no or substantially no voids.

The filler may be a solution prepared by mixing the hydrogenated polysiloxazane with a solvent. The solution may be coated in a solution process such as, e.g., spin coating and the like.

The filler layer 7 may be heat-treated. The heat treatment may be performed at, e.g., about 200° C. or higher under vapor-containing atmosphere.

Referring to FIG. 5, the filler layer 7 may be developed using a developing solution. The filler layer 7 disposed on the lower conductive layer 5 may be removed, e.g., leaving a part of the filler layer 7 that fills the gap 2, to form a predetermined filling pattern 7a.

Referring to FIG. 6, the conductive layer 5 disposed on the mold oxide layer 3 may be removed, e.g., leaving a part between the mold oxide layer 3 and the filling pattern 7a, to separate a lower electrode 5a with a predetermined shape. Herein, the lower conductive layer 5 may be removed in, e.g., a chemical mechanical polishing (CMP) method or an etch back method.

Referring to FIG. 7, the mold oxide layer 3 and the filling pattern 7a may be simultaneously removed, leaving a lower electrode 5a. The lower electrode 5a may have a U-shape. The mold oxide layer 3 and the filling pattern 7a may be removed, e.g., in a wet etching method. Herein, the wet etching method may include any material, with no particular limit, that may simultaneously remove the mold oxide layer 3 and the filling pattern 7a. For example, the wet etching method may include, e.g., a fluorine-containing etching solution e.g., at least one of hydrofluoric acid (HF) and ammonium fluoride (NH$_4$F).

Referring to FIG. 8, a dielectric layer 9 may be disposed on substantially an entire surface of a substrate including the lower electrode 5a. The dielectric layer 9 may substantially cover the outer and inner walls the lower electrode 5a. The lower electrode 5a may be U-shaped, such that the dielectric layer 9 may also has be U-shaped.

Referring to FIG. 9, an upper electrode 11 may be formed by laminating a conductive layer on the dielectric layer 9 and then photolithographying it. The upper electrode 11 may cover substantially the entire dielectric layer 9. The upper electrode 11 may fill a gap between both sides of the U-shaped lower electrode 5a and the U-shaped dielectric layer 9.

The lower electrode 5a, the dielectric layer 9, and the upper electrode 11 may form a capacitor of a semiconductor device.

The following examples illustrate exemplary embodiments in more detail. However, it is understood that the present invention is not limited by these examples.

<Fabrication of a Filler>

EXAMPLE 1

A 2 L reactor with an agitator and a temperature controller was filled with dry nitrogen. About 2.0 g of pure water was injected into about 1,500 g of dry pyridine and sufficiently mixed therewith. The mixture was stored in the reactor and maintained at about 5° C. Then, about 100 g of dichlorosilane was slowly injected thereinto for about one hour. While the resulting mixture was agitated, about 70 g of ammonia was slowly injected thereinto for about three hours. Then, dry nitrogen was injected for about thirty minutes in the reactor to remove the remaining ammonia therein.

The prepared white slurry-phased product was filtered under dry nitrogen atmosphere using a 1 μm TEFLON (tetrafluoroethylene) filter, preparing about 1,000 g of a filtered solution. Then, about 1,000 g of dry xylene was added thereto. The solvent was repetitively, three times in total, substituted from pyridine to xylene to adjust a solid concentration to about 20 wt %. The resulting product was filtered using a TEFLON (tetrafluoroethylene) filter with a pore size of about 0.03 μm.

The prepared hydrogenated polysiloxazane included oxygen in an amount of about 0.5 wt %, a $SiH_3/SiH$ (total) of about 0.20, and a weight average molecular weight of about 2,000.

Herein, the oxygen content was measured using FlashEA 1112 (made by Thermo Fisher Scientific Inc.). The $SiH_3/SiH$ (total) was measured using a 200 MHz proton NMR: AC-200 (made by Bruker Co.). The weight average molecular weight was measured using GPC; HPLC Pump 1515, RI Detector 2414 (made by Waters Ltd.) and Column: KF801, KF802, KF803 (made by Shodex Inc.).

EXAMPLE 2

A 2 L reactor with an agitator and a temperature controller was filled with dry nitrogen. About 1.1 g of pure water was injected into about 1,500 g of dry pyridine and sufficiently mixed therewith. The mixture was stored in the reactor and maintained at about 5° C. Next, about 100 g of dichlorosilane was slowly injected thereinto for about one hour. While the mixture was agitated, about 70 g of ammonia was slowly injected thereinto for about three hours. Then, dry nitrogen was injected thereinto for about thirty minutes, and ammonia remaining in the reactor was removed.

The prepared white slurry product was filtered under dry nitrogen atmosphere using a 1 μm TEFLON filter, acquiring about 1,000 g of a filtered solution. Then, about 1,000 g of dry xylene was added thereto. The solvent was repetitively, three times in total, substituted with xylene for pyridine to adjust the solid concentration to about 20%. The resulting product was filtered using a TEFLON tetrafluoroethylenefilter with a pore size of about 0.03 μm.

The prepared hydrogenated polysiloxazane had an oxygen content of about 2.1 wt %, a $SiH_3/SiH$ (total) of about 0.19, and a weight average molecular weight of about 2,700.

EXAMPLE 3

A 2 L reactor with an agitator and a temperature controller was filled with dry nitrogen. About 0.3 g of pure water injected into about 1,500 g of dry pyridine and sufficiently mixed together. The mixture was put in the reactor and kept warm at about 20° C. Next, about 100 g of dichlorosilane was slowly added thereto for about one hour. While the resulting mixture was agitated, about 70 g of ammonia was slowly injected thereinto for about three hours. Next, dry nitrogen was injected thereinto for about thirty minutes, and the ammonia remaining in the reactor was removed.

The prepared white slurry-phased product was filtered under dry nitrogen atmosphere using a 1 μm TEFLON filter, acquiring about 1,000 g of a filtered solution. Next, about 1,000 g of dry xylene was added thereto. The solvent was repetitively, three times in total, substituted with xylene for pyridine to adjust a solid concentration to about 20%. The resulting product was filtered using a TEFLON filter with a pore size of about 0.03 μm.

The hydrogenated polysiloxazane included an oxygen content of about 0.4%, a $SiH_3/SiH$ (total) of about 0.30, and a weight average molecular weight of about 2,600.

COMPARATIVE EXAMPLE 1

A 2 L reactor with an agitator and a temperature controller was filled with dry nitrogen. About 1,500 g of dry pyridine was injected in the reactor and sufficiently mixed together. The mixture was put in the reactor and kept warm at about 20° C. Next, about 100 g of dichlorosilane was slowly injected thereinto for about one hour. While the resulting mixture was agitated, about 70 g of ammonia was slowly injected thereinto for about three hours. Next, dry nitrogen was injected thereinto for about thirty minutes, and the ammonia remaining in the reactor was removed.

The prepared white slurry-phased product was filtered under dry nitrogen atmosphere using a 1 μm TEFLON filter, acquiring about 1,000 g of a filtered solution. Then, about 1,000 g of dry xylene was added thereto. The solvent was repetitively, three times in total, substituted with xylene for pyridine using a rotary evaporator, adjusting a solid concentration to about 20%. The resulting product was filtered with a TEFLON filter with a pore size of about 0.03 μm.

The prepared perhydropolysilazane had an oxygen content of about 0.0%, a $SiH_3/SiH$ (total) of about 0.22, and a weight average molecular weight of about 4,000.

COMPARATIVE EXAMPLE 2

A 2 L reactor with an agitator and a temperature controller was filled with dry nitrogen. About 1,500 g of dry pyridine was injected in the reactor and the mixture was put in the reactor and kept warm at about 5° C. Then, about 100 g of dichlorosilane was slowly injected thereinto for one hour. While the resulting mixture was agitated, about 70 g of ammonia was slowly injected for three hours. Then, dry nitrogen was injected thereinto for thirty minutes, and the ammonia remaining in the reactor was removed.

The prepared white slurry-phased product was filtered under dry nitrogen atmosphere using a 1 μm TEFLON filter, acquiring about 1,000 g of a filtered solution. Next, about 1,000 g of dry xylene was added thereto. The solvent was repetitively, three times in total, substituted with xylene for pyridine, adjusting a solid concentration to about 20%. The resulting product was filtered using a TEFLON filter with a pore size of about 0.03 μm.

The prepared perhydropolysilazane had an oxygen content of about 0.1%, a $SiH_3/SiH$ (total) of about 0.21, and a weight average molecular weight of about 1,800.

COMPARATIVE EXAMPLE 3

A 2 L reactor with an agitator and a temperature controller was filled with dry nitrogen. About 2.1 g of pure water was injected into about 1,500 g of dry pyridine. The mixture was put in the reactor and maintained at about 5° C. Then, about 100 g of dichlorosilane was slowly injected thereinto for about one hour. While the resulting mixture was agitated, about 70 g of ammonia was slowly injected thereinto for about three hours. Then, dry nitrogen was injected thereinto for about thirty minutes, and ammonia remaining in the reactor was removed.

The prepared white slurry-phased product was filtered under dry nitrogen atmosphere using a 1 μm TEFLON filter, acquiring about 1,000 g of a filtered solution. Next, about 1,000 g of dry xylene was added thereto. The solvent was repetitively, three times in total, substituted with xylene for pyridine using a rotary evaporator, adjusting a solid concentration to about 20%. The resulting product was filtered using a TEFLON filter with a pore size of about 0.03 μm.

The prepared perhydropolysilazane had an oxygen content of about 3.8%, a $SiH_3/SiH$ (total) of about 0.26, and a weight average molecular weight of about 2,000.

COMPARATIVE EXAMPLE 4

A 2 L reactor with an agitator and a temperature controller was filled with dry nitrogen. Next, about 0.3 g of pure water was injected into about 1,500 g of dry pyridine and sufficiently mixed together. The mixture was put in the reactor and maintained at −10° C. Then, about 100 g of dichlorosilane was slowly injected thereinto for one hour. While the resulting mixture was agitated, about 70 g of ammonia was slowly injected thereinto for three hours. Next, dry nitrogen was injected thereinto for thirty minutes, and ammonia remaining in the reactor was removed.

The prepared white slurry-phased product was filtered under dry nitrogen atmosphere using a 1 μm TEFLON filter, acquiring about 1,000 g of a filtered solution. Next, about 1,000 g of dry xylene was added thereto using a rotary evaporator. The solvent was repetitively, three times in total, substituted with xylene for pyridine, adjusting a solid concentration to about 20%. The resulting product was filtered using a TEFLON filter with a pore size of about 0.5 μm.

The hydrogenated polysiloxazane had an oxygen content of about 0.6%, a $SiH_3/SiH$ (total) of about 0.13, and a weight average molecular weight of about 1,100.

COMPARATIVE EXAMPLE 5

A 2 L reactor with an agitator and a temperature controller was filled with dry nitrogen. Next, about 0.3 g of pure water was injected into about 1,500 g of dry pyridine and sufficiently mixed together. The mixture was put in the reactor and kept warm at about 40° C. Then, about 100 g of dichlorosilane was slowly injected thereinto for one hour. While the mixture was agitated, about 70 g of ammonia was slowly injected thereinto for three hours. Next, dry nitrogen was injected thereinto for thirty minutes, and ammonia remaining in the reactor was removed.

The prepared white slurry-phased product was filtered under dry nitrogen atmosphere using a 1 μm TEFLON filter, acquiring about 1,000 g of a filtered solution. Next, about 1,000 g of dry xylene was added thereto. The solvent was repetitively, three times in total, substituted with xylene for pyridine, adjusting a solid concentration to about 20%. The resulting product was filtered with a TEFLON filter with a pore size of about 0.5 μm.

The hydrogenated polysiloxazane had an oxygen content of about 0.5%, a $SiH_3/SiH$ (total) of about 0.38, and a weight average molecular weight of about 4,000.

<Filling Pattern Formation>

Trenches with 30 nm (width)×300 nm (height), 50 nm (width)×300 nm (height), and 70 nm (width)×300 nm (height) were formed on several silicon wafers. Fillers according to Examples 1 to 3 and Comparative Examples 1 to 5 were coated in respective trenches using a spin coating method and dried on a hot plate at about 100° C. The resulting product was heat-treated for about one hour at 800° C. under oxygen atmosphere having a vapor partial pressure of 5 kPa.

<Evaluation>

The filling patterns were respectively identified regarding an etching rate ratio inside the trenches, an etching rate ratio outside of the trenches, and a flatness of the filler layer.

The etching rate ratio was evaluated in the following method:
1. A substrate with the filling pattern was cut and observed regarding its cross-section with an electron scanning microscope (SEM) to measure its layer height.
2. The substrate was dipped in a 0.5 wt % hydrofluoric acid aqueous solution and etched. It was cut and observed regarding cross-section with an electron scanning microscope. Then, its layer height was measured.
3. The steps 1 and 2 were continued until the trenches were etched to the bottom. The relationship between etching time and etching amount was demonstrated.
4. Calculated were an etching rate of a flat part and inside the trench and then, an etching rate of the flat part and outside the trench.

Etching interface was evaluated in the following method:
1. A substrate with the filling pattern was cut.
2. The substrate was dipped in a 0.5 wt % hydrofluoric acid aqueous solution for thirty seconds for etching, and then cleaned and dried.
3. The substrate was observed regarding cross-section with a scanning electron microscope (SEM) and checked whether an etching interface inside the trench was rough and had a void.

The results are shown in Table 1.

TABLE 1

| | Ratio of etching rate (trench part/ flat part) | | | Flatness of filler layer | | |
|---|---|---|---|---|---|---|
| | Trench width (nm) | | | | | |
| | 30 | 50 | 70 | 30 | 50 | 70 |
| Example 1 | 2.6 | 2.2 | 2.0 | ○ | ○ | ○ |
| Example 2 | 2.8 | 2.5 | 2.4 | ○ | ○ | ○ |
| Example 3 | 2.4 | 2.1 | 1.8 | ○ | ○ | ○ |
| Comparative Example 1 | 5.0 | 3.8 | 2.4 | X | ○ | ○ |
| Comparative Example 2 | 4.9 | 3.8 | 2.4 | X | X | ○ |
| Comparative Example 3 | 5.6 | 4.5 | 3.0 | X | X | ○ |
| Comparative Example 4 | >10 | 7.5 | 5.0 | X | X | X |
| Comparative Example 5 | 4.9 | 4.2 | 2.8 | X | X | ○ |

○: uniform,
X: non-uniform

When the fillers according to Examples 1 to 3 were used, the filler layers had an etching rate ratio of less than 3. For example, a fine trench with a width of about 30 nm and 50 nm maintained a low etching rate ratio. In addition, the filler layers had excellent flatness.

On the contrary, when the fillers according to Comparative Examples 1 to 5 were used, the filler layers had a high etching rate ratio. For example, a fine trench has much higher etching rate ratio. In addition, the filler layers had poor flatness. Even a fine trench had much worse flatness. Therefore, when a filler according to an exemplary embodiment was used, a fine trench with a small width had excellent filling properties and flatness.

While embodiments have been described, it is to be understood that the invention is not limited to the disclosed embodiments, but, on the contrary, is intended to cover various modifications and equivalent arrangements included within the spirit and scope of the appended claims. Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

Embodiments are directed to a filler for filling a gap and a method of manufacturing a semiconductor capacitor using the filler.

The embodiments provide a filler for filling a gap that has excellent filling properties and flatness.

The embodiments provide a method of manufacturing a semiconductor capacitor using the filler that has excellent filling properties and flatness.

What is claimed is:

1. A filler for filling a gap, the filler comprising:
a hydrogenated polysiloxazane having an oxygen content of about 0.2 to about 3 wt %, wherein:
a chemical structure of the hydrogenated polysiloxazane includes first and second moieties represented by the following respective Chemical Formulas 1 and 2:

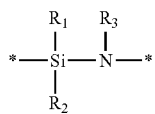
[Chemical Formula 1]

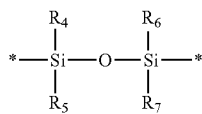
[Chemical Formula 2]

wherein, $R_1$ to $R_7$ are each independently one of a hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof; and
a terminal end of the hydrogenated polysiloxazane includes a third moiety represented by the following Chemical Formula 3:

   [Chemical Formula 3]

wherein an amount of the third moiety is about 15 to about 35% based on a total amount of Si—H bonds in the hydrogenated polysiloxazane.

2. The filler for filling a gap as claimed in claim 1, wherein the hydrogenated polysiloxazane has a weight average molecular weight of about 1,000 to about 5,000.

3. The filler for filling a gap as claimed in claim 1, wherein the oxygen content of the hydrogenated polysiloxazane is about 0.4 to about 2 wt %.

4. The filler for filling a gap as claimed in claim 1, wherein an amount of the hydrogenated polysiloxazane is about 0.1 to about 50 wt % based on a total weight of the filler.

5. The filler for filling a gap as claimed in claim 1, further comprising a thermal acid generator that is capable of generating an acid when heated, an amount of the thermal acid generator being about 0.01 to about 25 wt % based on a total weight of the filler.

6. The filler for filling a gap as claimed in claim 1, further comprising a surfactant, an amount of the surfactant being about 0.001 to about 10 wt % based on a total weight of the filler.

7. The filler for filling a gap as claimed in claim 1, wherein the filler is capable of substantially filling the entire gap, the gap having a width of less than about 50 nm, having a height greater than the width, and being surrounded by a conductive layer of an electrode.

8. The filler for filling a gap as claimed in claim 2, wherein the weight average molecular weight of the hydrogenated polysiloxazane is about 1,500 to about 3,500.

9. A method of fabricating a semiconductor capacitor, the method comprising
forming a mold layer with a gap on a semiconductor substrate;
forming a conductive layer on the semiconductor substrate and the mold layer;
forming a filler layer by coating a filler in the gap and on the conductive layer;
heat-treating the filler layer;
developing a part of the filler layer to form a filling pattern in the gap;
removing a part of the conductive layer to form a first electrode;
removing the mold layer and the filling pattern;
forming a dielectric layer on the first electrode;
forming a second electrode on the dielectric layer, and
wherein the filler includes a hydrogenated polysiloxazane having an oxygen content of about 0.2 to about 3 wt %, wherein:
a chemical structure of the hydrogenated polysiloxazane includes first and second moieties represented by the following respective Chemical Formulas 1 and 2:

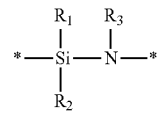
[Chemical Formula 1]

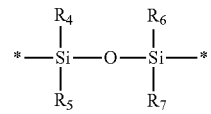
[Chemical Formula 2]

wherein, $R_1$ to $R_7$ are each independently one of a hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a substituted or unsubstituted carbonyl group, a hydroxy group, or a combination thereof; and
a terminal end of the hydrogenated polysiloxazane includes a third moiety represented by the following Chemical Formula 3:

   [Chemical Formula 3]

wherein an amount of the third moiety is about 15 to about 35% based on a total amount of Si—H bonds in the hydrogenated polysiloxazane.

10. The method as claimed in claim 9, wherein the hydrogenated polysiloxazane has a weight average molecular weight of about 1,000 to about 5,000.

11. The method as claimed in claim 9, wherein the oxygen content of the hydrogenated polysiloxazane is about 0.4 to about 2 wt %.

12. The method as claimed in claim 9, wherein an amount of the hydrogenated polysiloxazane is about 0.1 to about 50 wt % based on a total weight of the filler.

13. The method as claimed in claim 9, wherein heat-treating the filler is performed at about 200° C. or higher under a vapor-containing atmosphere.

14. The method as claimed in claim 9, wherein the filler includes a thermal acid generator that is capable of generating an acid when heated, such that an amount of the thermal acid generator is about 0.01 to about 25 wt % based on a total weight of the filler.

15. The method as claimed in claim 9, wherein the filler includes a surfactant, such that an amount of the surfactant is about 0.001 to about 10 wt % based on a total weight of the filler.

16. The method as claimed in claim 9, wherein the filler substantially fills the entire gap, the gap having a width of less than about 50 nm, having a height greater than the width, and being surrounded by the conductive layer.

17. The method as claimed in claim 9, wherein the oxygen content of the hydrogenated polysiloxazane is based on an amount of pure water added during an intermediate step of forming filler.

18. The method as claimed in claim 10, wherein the weight average molecular weight of the hydrogenated polysiloxazane is about 1,500 to about 3,500.

* * * * *